(12) United States Patent
Pullela

(10) Patent No.: US 6,645,819 B2
(45) Date of Patent: Nov. 11, 2003

(54) SELF-ALIGNED FABRICATION METHOD FOR A SEMICONDUCTOR DEVICE

(75) Inventor: Rajashekhar Pullela, Westlake Village, CA (US)

(73) Assignee: GTRAN, Inc., Newbury Park, CA (US)

(*) Notice: Subject to any disclaimer, the term of this patent is extended or adjusted under 35 U.S.C. 154(b) by 0 days.

(21) Appl. No.: 10/033,099

(22) Filed: Oct. 19, 2001

(65) Prior Publication Data
US 2003/0077898 A1 Apr. 24, 2003

(51) Int. Cl.$^7$ .......................... H01L 21/8222
(52) U.S. Cl. .......................... 438/319; 117/90
(58) Field of Search .......................... 438/312, 319–320, 438/739; 257/197, 200, 466, 618, 622–624, 586–587; 117/90, 94–96, 954–955

(56) References Cited

U.S. PATENT DOCUMENTS

| | | | |
|---|---|---|---|
| 5,124,270 A | * | 6/1992 | Morizuka .................. 438/319 |
| 5,206,524 A | * | 4/1993 | Chen et al. ................ 257/29 |
| 5,726,468 A | * | 3/1998 | Oku et al. ................. 257/197 |
| 5,789,301 A | * | 8/1998 | Hill ........................ 438/319 |
| 6,294,018 B1 | * | 9/2001 | Hamm et al. ............... 117/90 |

* cited by examiner

Primary Examiner—David Nelms
Assistant Examiner—DavId Vu
(74) Attorney, Agent, or Firm—T J Singh; Klein, O'Neilll & Singh, LLP (57) ABSTRACT

One embodiment of the present invention provides a method of fabricating a semiconductor device including the steps of forming a first semiconductor layer; forming a second semiconductor layer over the first semiconductor layer; forming a mask over a first portion the second semiconductor layer; removing a second portion of the second semiconductor layer not covered by the mask; forming a first electrical connector on the first semiconductor layer; and forming a second electrical connector on the first portion of the second semiconductor layer.

89 Claims, 10 Drawing Sheets

SELF-ALIGNED FABRICATION METHOD FOR A SEMICONDUCTOR DEVICE

BACKGROUND OF THE INVENTION

1. Field of the Invention

The present invention relates to a method for manufacturing semiconductor devices using a self-aligned fabrication process.

2. Background

Fabrication of an integrated circuit ("IC") comprises a sequence of processing steps to produce electrical devices contained in a semiconductor chip. During the production of ICs, various layers of thin films of dielectrics (e.g., $SiO_2$, $Si_3N_4$, etc.), polysilicon and metal conductors (e.g., Al, Ni, Au, Pt, Ti, etc.) are grown or deposited on the surface of a semiconductor wafer ("wafer"), one on top of the other.

Deposition is an operation in which a film is placed on the wafer surface, usually without a chemical reaction with the underlying layer. Deposition is also known as "evaporation". Two common techniques used for forming these thin films are physical vapor deposition and chemical vapor deposition. Chemical vapor deposition is a process in which insulating or conducting films are deposited on a substrate by use of reactant gasses and an energy source to produce a gas-phase chemical reaction. The energy source may be thermal, optical or plasma in nature. Physical vapor deposition is a process in which a conductive or insulting film is deposited on a wafer surface without the assistance of a chemical reaction. Examples of physical vapor deposition include vacuum evaporation and sputtering.

To perform its intended function, each deposited layer must be located within a specific region on the wafer surface. This is accomplished by forming a desired layer and then patterning and etching it to provide a certain device function in specific areas of the wafer. Often a mask is used in this patterning and etching process. Lithography is a transfer process where the pattern on the mask is replicated in a radiation-sensitive layer located below the mask on the wafer surface. Typically, this has been accomplished with UV light as the radiation source and photo-resist ("resist"), which is a UV-sensitive polymer, as the mask layer. First, a few drops of resist are deposited on a wafer which is spinning at a slow rate to produce a uniform coating and the spin speed is increased to enhance drying. The wafer with resist is softbaked at 80–90° Centigrade for 10–30 minutes to drive off the remaining solvents. Next, the wafers are put in an exposure system and the mask pattern to be transferred is aligned to any existing wafer patterns. The resist is exposed through the mask to UV radiation that changes its structure, depending upon whether the resist type is positive or negative. For a positive type resist, the resist dissipates when exposed to light and a subsequent solvent application. In contrast, the negative type resist hardens after exposure to light and is not removed by the subsequent solvent application. The resist is not affected in regions where the mask is opaque in either case. After full wafer exposure the resist is developed such that the unpolymerized regions are selectively dissolved in an appropriate solvent. The polymerized portion of the resist remains intact on the wafer surface reflecting the opaque features of the mask in a positive resist and just the opposite for a negative resist.

After the resist pattern is formed it is then transferred to the surface layer of the wafer. Sometimes this is an invisible layer, such as ion implantation, but more often than not it is a physical transfer of the pattern by etching the surface layer, using the resist as a mask. This either results in the desired structure or produces a more etch-resistant mask for further pattern transfer operations.

Two common types of etching processes used in semiconductor fabrication include wet etching and dry etching. Wet etching is a process which uses liquid chemical reactions with unprotected regions of a wafer to remove specific layers of the substrate. During wet etching, wafers with resist (or a resist transferred mask) are immersed in a temperature-controlled etchant for a fixed period of time. The etch rate is dependent on the strength of the etchant, temperature and material being etched. Such chemical etches are isotopic, which means that the vertical and lateral etch rates are the same. Thus, the thicker the layer being etched, the more undercutting of the mask pattern. Most wet etches are stopped with an underlying etchstop layer that is impervious to the etchant used to remove the top layer.

Dry etching is also used during semiconductor fabrication. Dry etching is a process that uses gas-phase reactants, inert or active ionic species or a combination of these techniques to remove unprotected layers of a substrate by chemical and/or physical processes. Unlike wet etching, dry etching is an anisotropic etching process, such that the etch rate may be varied in different directions. One common dry etching technique is called plasma etching, which uses a rf plasma to generate chemically active etchants that form volatile etch species with the substrate. In plasma etching, a wafer is placed between two plates and a voltage is applied to the plates that ionizes gases in between the plates to accomplish the etching. Typically, chlorine or fluorine compounds, most notably $CCl_4$ and $CF_4$, have been tailored for etching $SiO_2$, $Si_3N_4$ and metal layers. Another example of dry etching is known as ion etching. Ion etching is accomplished using an inactive species (e.g., Ar ions) either in a beam or with a parallel plate sputtering system.

In a semiconductor device, two different layers may be electrically connected together using a contact, usually made of metal. The fabrication process of the contact depends on the type of layers that are to be connected. Two common techniques used for evaporating metals are physical vapor deposition and chemical vapor deposition, as discussed above.

One common type of semiconductor device is called a transistor. Typically, ICs often comprises many thousands or millions of transistors as building blocks for various electrical circuits. Transistors are comprised of an emitter layer, a collector layer and a base layer. Transistors often act as switches by controlling a primary current flow from the collector to the emitter. A much smaller secondary current is applied to the base to control the primary current.

One type of transistor used in ICs is known as a heterojunction bipolar transistor, or "HBT". HBTs are designed by varying the band-gap energy levels of the emitter and base layers in order to maximize performance. HBTs are used in many applications, such as in semiconductor chips used for communication systems including optical components, wireless power amplifiers for cell phones and base stations, low noise amplifiers and high performance analog to digital converters.

When considering construction of an HBT, the base to emitter separation distance is important for the reliability and high frequency performance of the device. For example, improper production of the base-emitter separation may effect the yield loss of the wafers during the manufacturing process. In addition, the mean time for failure ("MTTF"), which is a measure of the reliability of the HBT under typical operating conditions, depends on the base-emitter separation and the properties of the dielectric layer that passivates the base-emitter interface. Further, because a significant part of the base resistance in the HBT is directly proportional to the base-emitter separation, a greater separation provides a higher base resistance, resulting in a degradation of the power gain of the HBT at high frequencies. Accordingly, high frequency performance is improved by providing a base-emitter separation that is as small as possible.

One conventional process of manufacturing a HBT is known as a self-aligned fabrication process. This fabrication process is considered "self-aligned" because the base-emitter separation is not defined by lithography. Rather, the base-emitter separation is defined by the shape of the elements in the transistor, specifically, by the shape of an overhang of the emitter over the base as described below.

Figure 1:
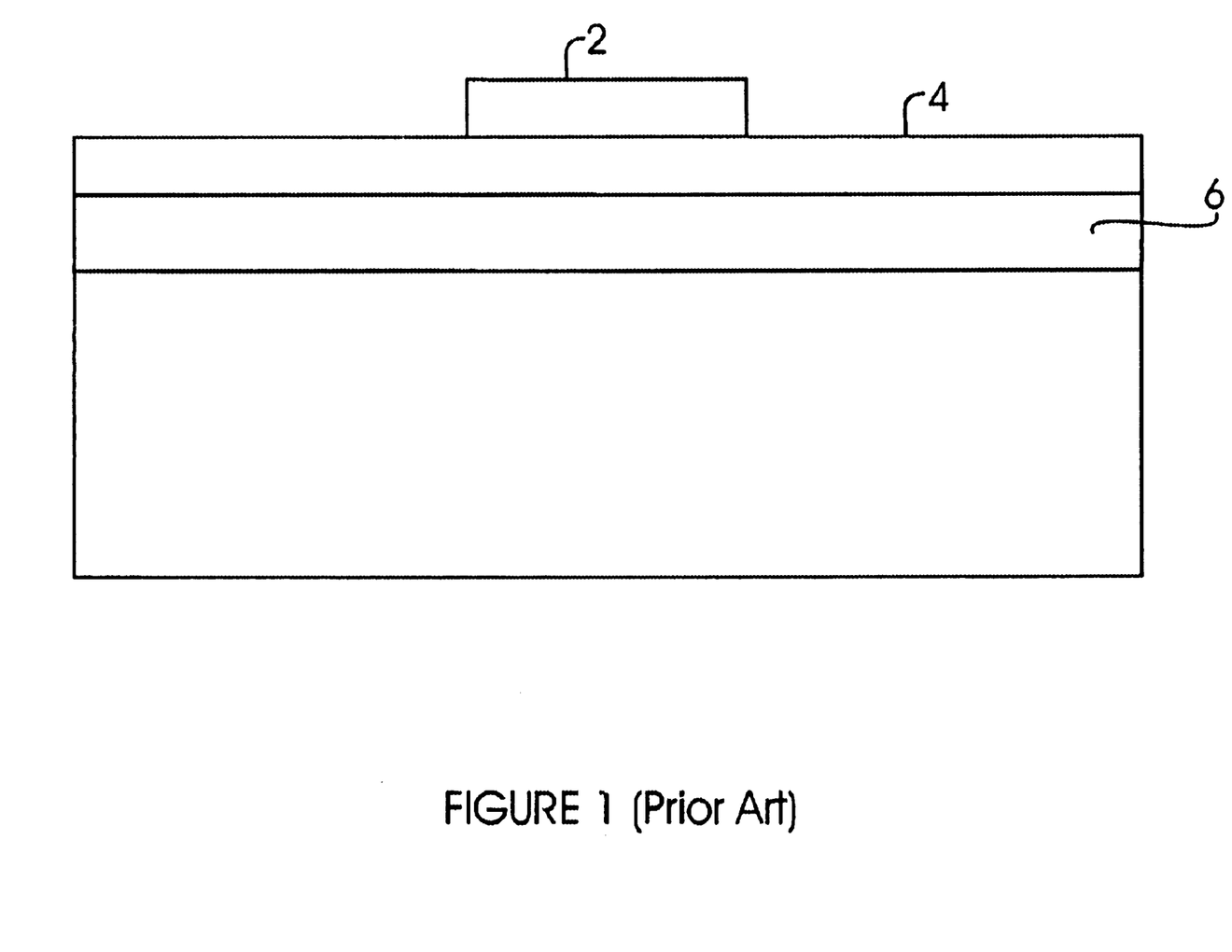
FIG. 1 described above, is a cross-section diagram of a transistor fabricated by a conventional self-aligned fabrication process.

A conventional HBT self-aligned fabrication process is illustrated in FIGS. 1–4. FIG. 1 shows a cross-section view of a HBT the first stage of the conventional self-aligned fabrication process. As shown in FIG. 1, initially, the transistor comprises and emitter contact 2, an emitter semiconductor layer 4 and a base semiconductor layer 6. The emitter contact 2 is bonded on top of the emitter semiconductor layer 4, which is bonded on top of the base semiconductor layer 6. The emitter contact 2 is typically a metal and provides an electrical connection between the emitter semiconductor layer 4 and any other layers of the semiconductor device.

Figure 2:
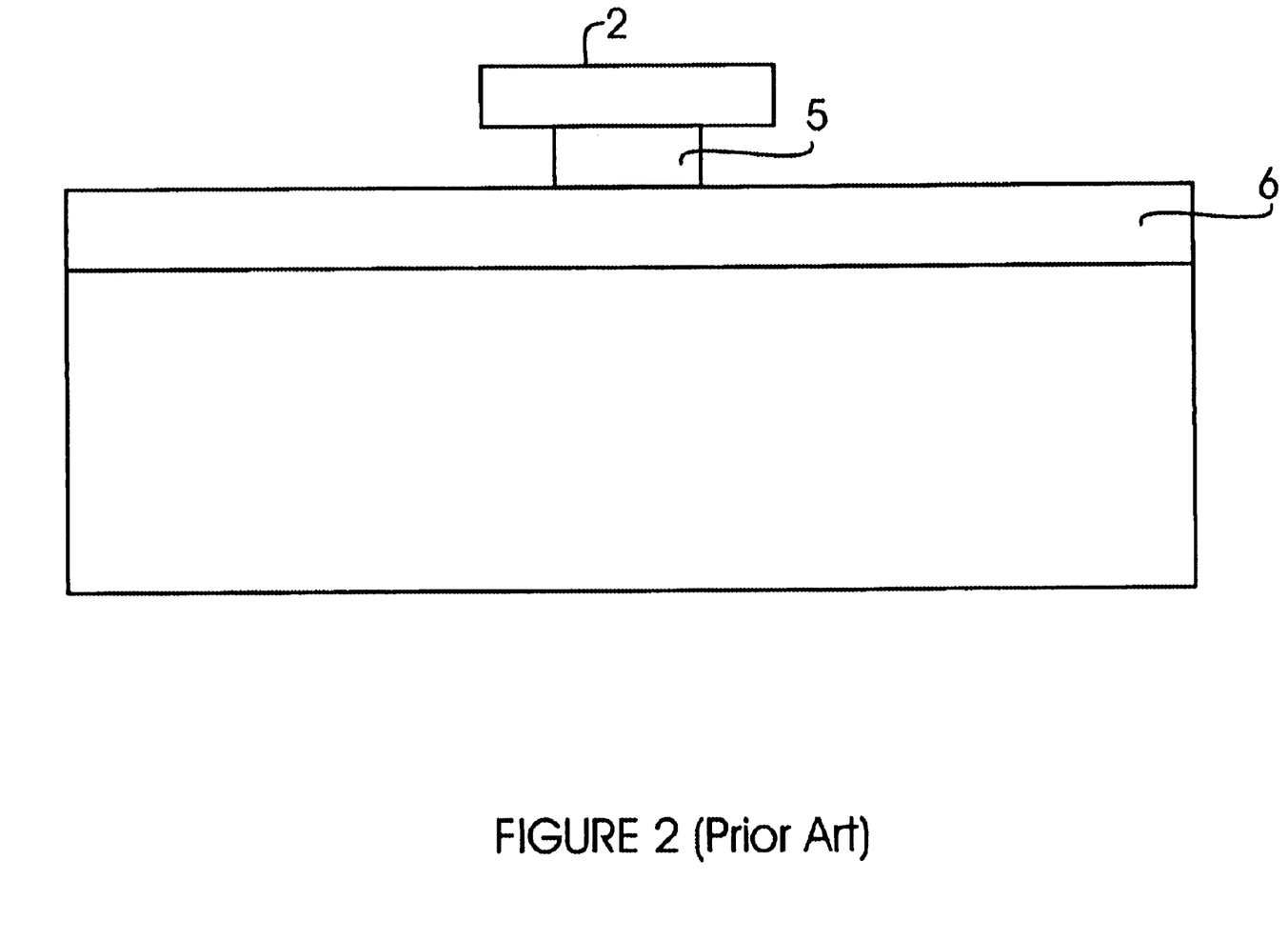
FIG. 2 described above, is a cross-section diagram of a transistor fabricated by a conventional self-aligned fabrication process.

The next step in the conventional self-aligned HBT fabrication process involves etching away a portion of the emitter semiconductor layer 4 to form an emitter semiconductor mesa 5, as shown in FIG. 2. This etching process is typically accomplished by using a combination of dry and wet etching processes. The wet etching process is stopped so that the emitter contact 2 slightly overhangs the emitter semiconductor mesa 5 (or, the emitter semiconductor mesa 5 undercuts the emitter contact 2).

Figure 3:
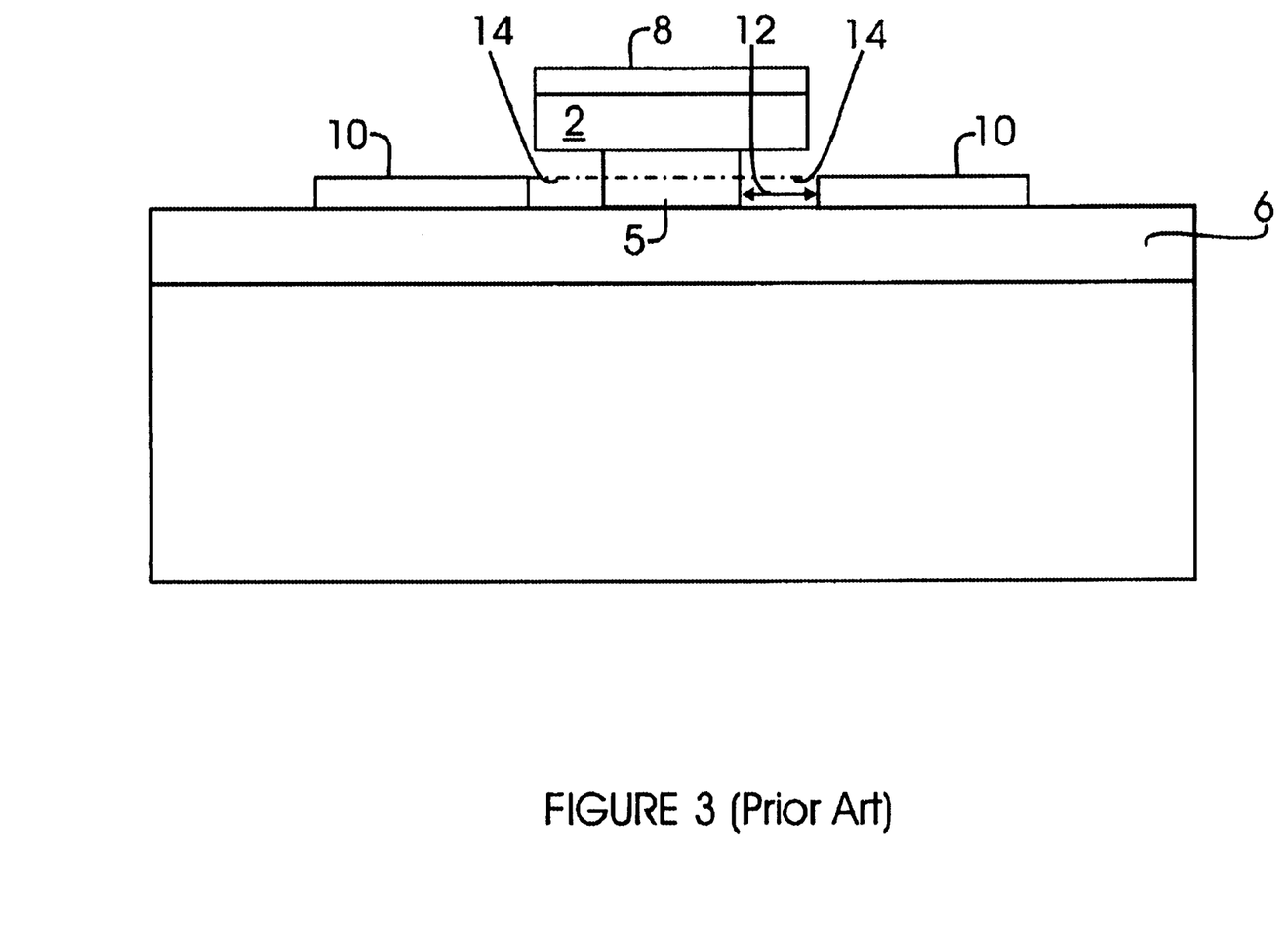
FIG. 3 described above, is a cross-section diagram of a transistor fabricated by a conventional self-aligned fabrication process.

As shown in FIG. 3, the next step in the conventional self-aligned HBT fabrication process involves the deposition (evaporation) of a base contact 10 onto the base semiconductor layer 6. Typically, the base contact 10 is a metal. In addition, an add-on emitter contact 8 is deposited onto the emitter contact 2. The add-on emitter contact 8 comprises the same material as the emitter contact 2 (i.e., a metal) and provides identical electrical characteristics.

As shown in FIG. 3, the emitter semiconductor mesa 5 and the base contact 10 are separated by a base-emitter separation distance 12. The emitter contact 2 is used as a mask to create the emitter semiconductor mesa 5 during the wet etching process. When the base contact 10 is evaporated around the emitter semiconductor mesa 5 and the add-on emitter contact 8 is evaporated on the emitter semiconductor mesa 5, the overhang of the emitter contact 2 provides a clean separation between the emitter add-on emitter contact 8 (that lands on top of the emitter contact 2), and the base contact 10 (that lands on the base semiconductor layer 6).

Finally, gap 14 must be passivated. Gap 14 is a volume of space between the emitter semiconductor layer 4 and the base contact 10. Gap 14 is generally rectangular in shape, however, other shapes are possible depending upon the size and shape of the emitter contact 2. Typically, the passivation is completed by depositing a layer of silicon nitride or some other polymer layer such as polyimide or Benzo-cyclo-Butene ("BCB").

Figure 4:
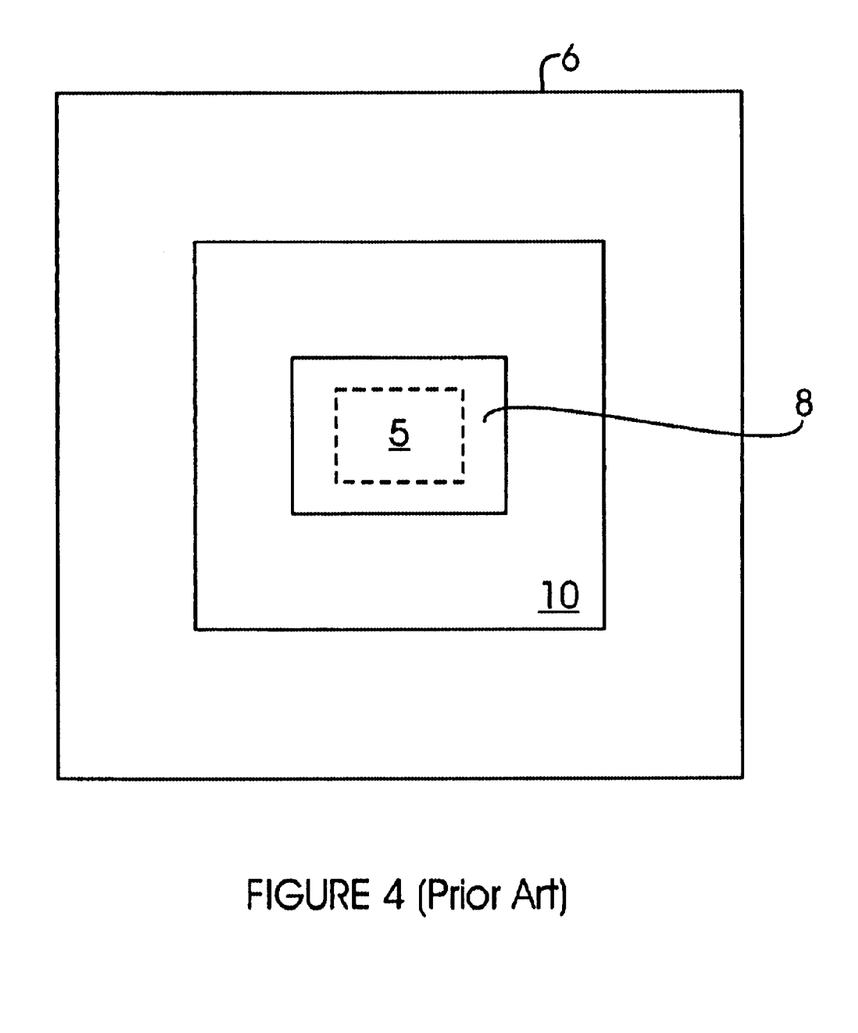
FIG. 4 described above, is a top-view of a transistor fabricated by a conventional self-aligned fabrication process.

FIG. 4 shows a top-level view of the HBT during the same stage of the conventional HBT fabrication process as shown in FIG. 3. In FIG. 4, the add-on emitter contact metal 8 overhangs the emitter semiconductor mesa 5, which is encircled by the base contact 10. In addition, the base contact 10 is fabricated within the base semiconductor layer 6.

The conventional HBT self-aligned fabrication process has several inherent drawbacks. For example, it is important to keep the base-emitter separation 12 as small as possible for better performance of the transistor. In the conventional self-aligned fabrication process, the base-emitter separation 12 is determined by use of the overhang of the emitter contact 2 over the emitter semiconductor mesa 5. However, this overhang leads to the creation of gap 14, which is difficult to completely fill in because of the relative closeness of the emitter contact 2 and base contact 10. In particular, because the height of the emitter semiconductor layer 4 is typically in the range of 1000–2500 A, while the height of the base contact 10 is usually in the range of 1000–1500 A, there is only a small opening of approximately 500–1500 A between the emitter contact 2 and the base contact 10. Accordingly voids may be present in gap 14 after passivation, which leads to performance and yield losses.

Another disadvantage in the conventional HBT fabrication process results from the relative closeness of the emitter contact 2 and the base contact 10 (i.e., approximately 500–1500 A). If there is any type of defect on either the emitter contact 2 or the base contact 10, a short circuit may occur between the emitter semiconductor layer 4 and the base semiconductor layer 6 of the transistor, which also may result in unacceptable yield losses.

Another disadvantage of the conventional HBT fabrication process is due to the fact that the under-cut of the emitter semiconductor mesa 5, and relatedly, the base-emitter separation distance 12 is controlled by a wet etching process. Because the wet etching process is relatively difficult to control, especially in the presence of metal which can act as a catalyst (i.e., in this case the emitter contact 2), under some conditions the wet etching process may proceed at a relatively higher rate below the emitter contact 2, thus giving rise to a variation in the emitter semiconductor area (i.e., smaller), the emitter resistance and the base resistance.

Therefore, there is a need for a HBT self-aligned fabrication process and device that provides higher yield and faster performance.

SUMMARY OF THE INVENTION

One embodiment of the present invention provides a method of fabricating a semiconductor device including the steps of forming a first semiconductor layer; forming a second semiconductor layer over the first semiconductor layer; forming a mask over a first portion the second semiconductor layer; removing a second portion of the second semiconductor layer not covered by the mask; forming a first electrical connector on the first semiconductor layer; and forming a second electrical connector on the first portion of the second semiconductor layer.

In an embodiment, the first semiconductor layer comprises one or more substances from a group consisting of gallium arsenide and indium phosphide, and is approximately 300–1000 A deep. In an embodiment, the second semiconductor layer comprises one or more substances from a group consisting of silicon, gallium arsenide and indium phosphide and is approximately 1000–3000 A deep. In an embodiment, the mask comprises a photo-resist layer that is approximately 1–3 microns deep.

In an embodiment, the step of forming a mask over a first portion of the second semiconductor layer further includes the step of creating one or more openings in the mask that include a top surface and a bottom surface next to the second semiconductor layer. In addition, the mask is wider at the top surface of the mask and narrower at the bottom surface and is a substantially overhanging shape.

In an embodiment, the step of removing a second portion of the second semiconductor layer is performed by wet etching or dry etching.

In an embodiment, the first electrical connector includes a layer of titanium that is approximately 100–200 A deep, a layer of platinum over the layer of titanium that is approximately 300–400 A deep and a layer of gold over the layer of platinum that is approximately 1000 A–1.2 microns deep. In another embodiment, the first electrical connector includes a layer of palladium that is approximately 100–200 A deep, a layer of platinum over the layer of titanium that is approximately 300–400 A deep and a layer of gold over the layer of platinum that is approximately 1000 A–1.2 microns deep. In an embodiment, the first electrical connector is approximately one micron in width.

In an embodiment, the second electrical connector includes a layer of titanium that is approximately 100–200 A deep, a layer of platinum over the layer of titanium that is approximately 300–400 deep and a layer of gold over the layer of platinum that is approximately 1000 A–1.2 microns deep. In a further embodiment, the second electrical connector is approximately one micron in width.

In an embodiment, the steps of forming the first and second electrical connectors are performed by evaporation. In another embodiment, the semiconductor device is a heterojunction bipolar transistor and the first electrical connector is located approximately 0.3 micron from the first portion of the second semiconductor layer.

BRIEF DESCRIPTION OF THE DRAWINGS

The present invention will be described with particular embodiments thereof, and references will be made to the drawings in which.

DETAILED DESCRIPTION

Figure 5:
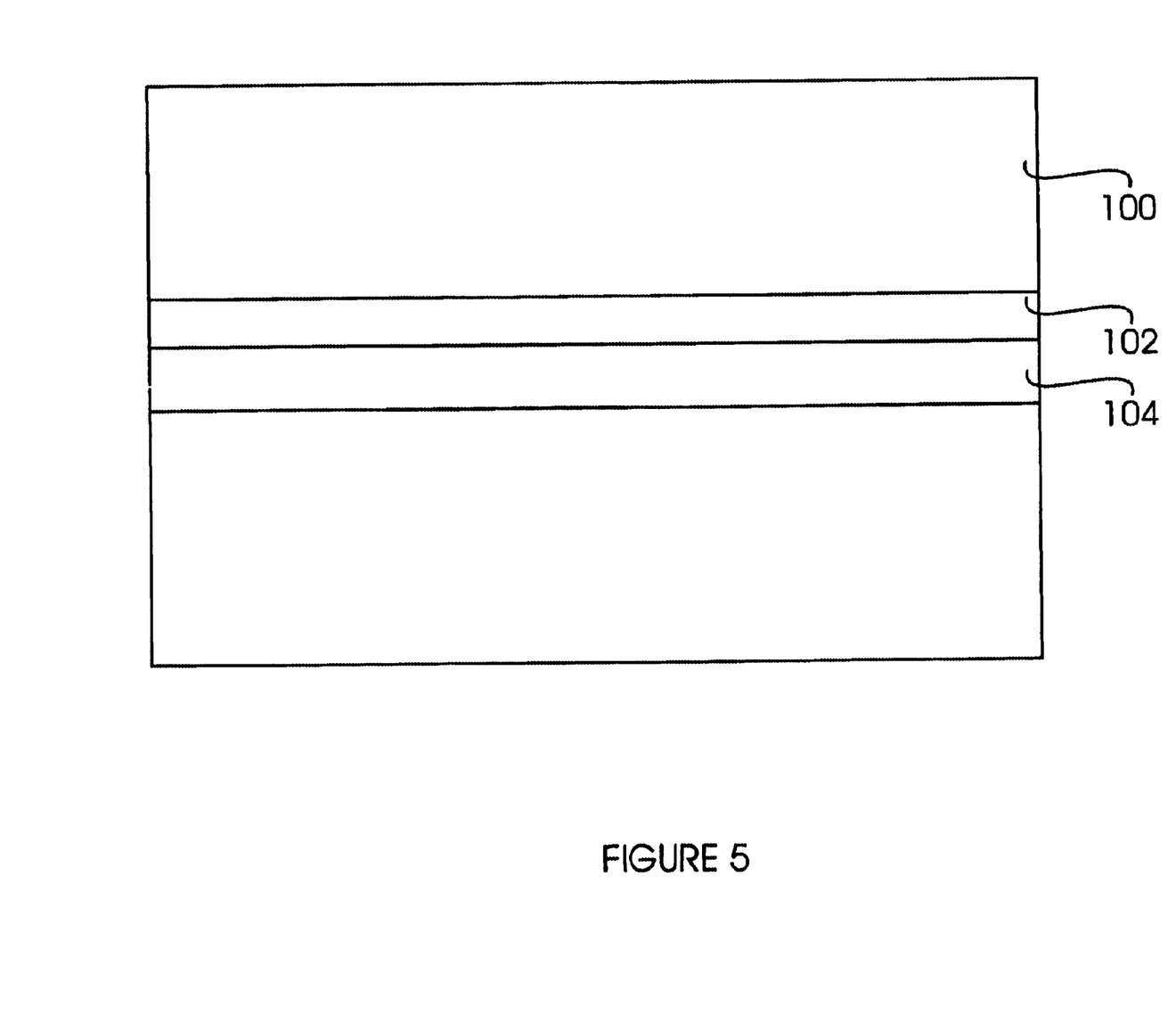
FIG. 5 is a cross-section view of a transistor fabricated by a self-aligned fabrication process in an embodiment of the present invention.

FIGS. 5–10 are a series of cross-section views of a transistor fabricated using the self-aligned fabrication process in an embodiment according to the present invention. As shown in FIG. 5, initially the transistor comprises a photo-resist layer 100, an emitter semiconductor layer 102 and a base semiconductor layer 104. Typically, the photo-resist layer 100 may comprise an organic polymer composition. In an embodiment, the photo-resist layer 100 may be approximately 1–3 microns deep. The emitter semiconductor layer 102 and the base semiconductor layer 104 may comprise semiconductor material such as gallium arsenide or indium phosphide. Typically, the emitter semiconductor layer 102 may range from 1000–3000 A deep, and in an embodiment, may be 1250 or 2250 A. Typically, the base semiconductor layer 104 may range from 300–1000 A deep, and in an embodiment, may be 500 A deep.

Figure 6:
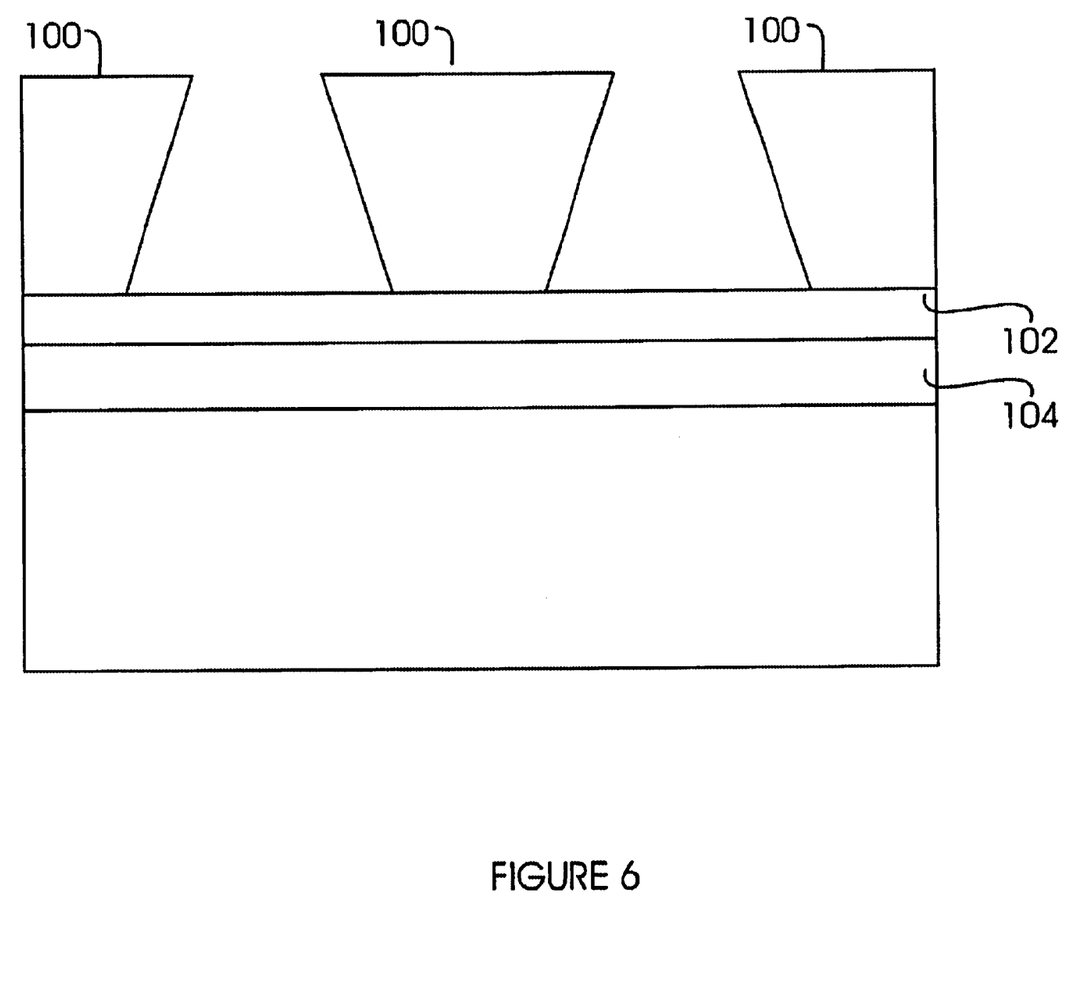
FIG. 6 is a cross-section view of a transistor fabricated by a self-aligned fabrication process in an embodiment of the present invention.
Figure 7:
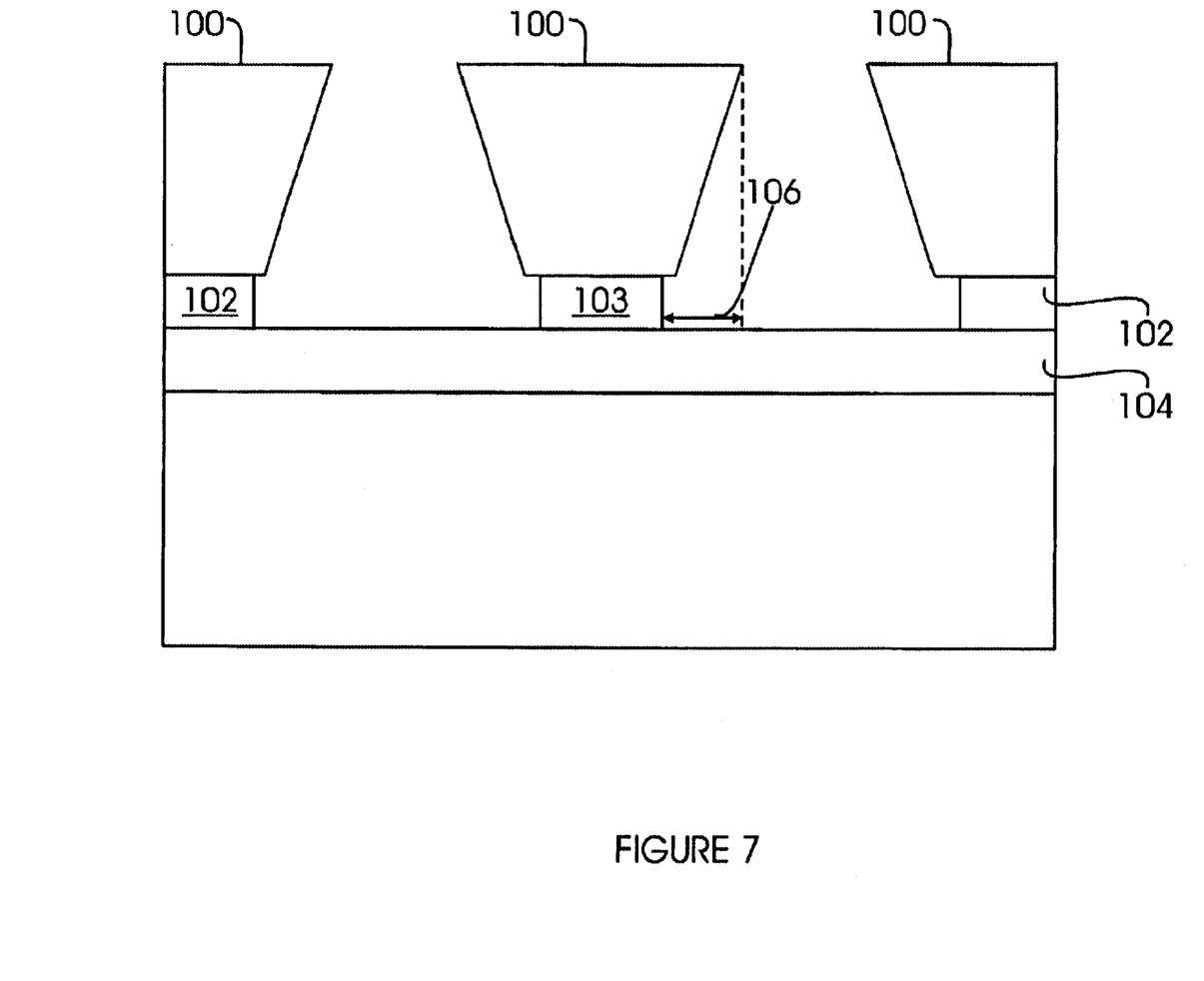
FIG. 7 is a cross-section view of a transistor fabricated by a self-aligned fabrication process in an embodiment of the present invention.

During the next step of the HBT self-aligned fabrication process, a pattern is produced in the photo-resist layer 100 as shown in FIG. 6. The pattern may comprise a series of windows and is used to define the emitter and base junctions in the following steps. Typically, after the windows are created, the top of the photo-resist layer 100 will be larger than the bottom of the layer 100 that is attached to the emitter semiconductor layer 102. Thus, an overhang shape is created in the photo-resist layer 100 as shown in FIG. 7.

Next, a wet or dry etch is applied to the emitter semiconductor layer 102. The etching process proceeds until the base semiconductor layer 104 is exposed and an emitter semiconductor mesa 103 is produced. In an embodiment, the emitter semiconductor mesa 103 may be approximately one micron in width. Because of the overhang shape of the photo-resist layer 100, a precise base-emitter separation 106 can be provided for the transistor. While an overhang comprising a straight angled shape is shown in FIG. 7, it is understood that the present invention allows for many other shapes that comprise an overhang of the photo-resist layer 100 from top to bottom, such as a "T" shape, a curved shape, etc.

Figure 8:
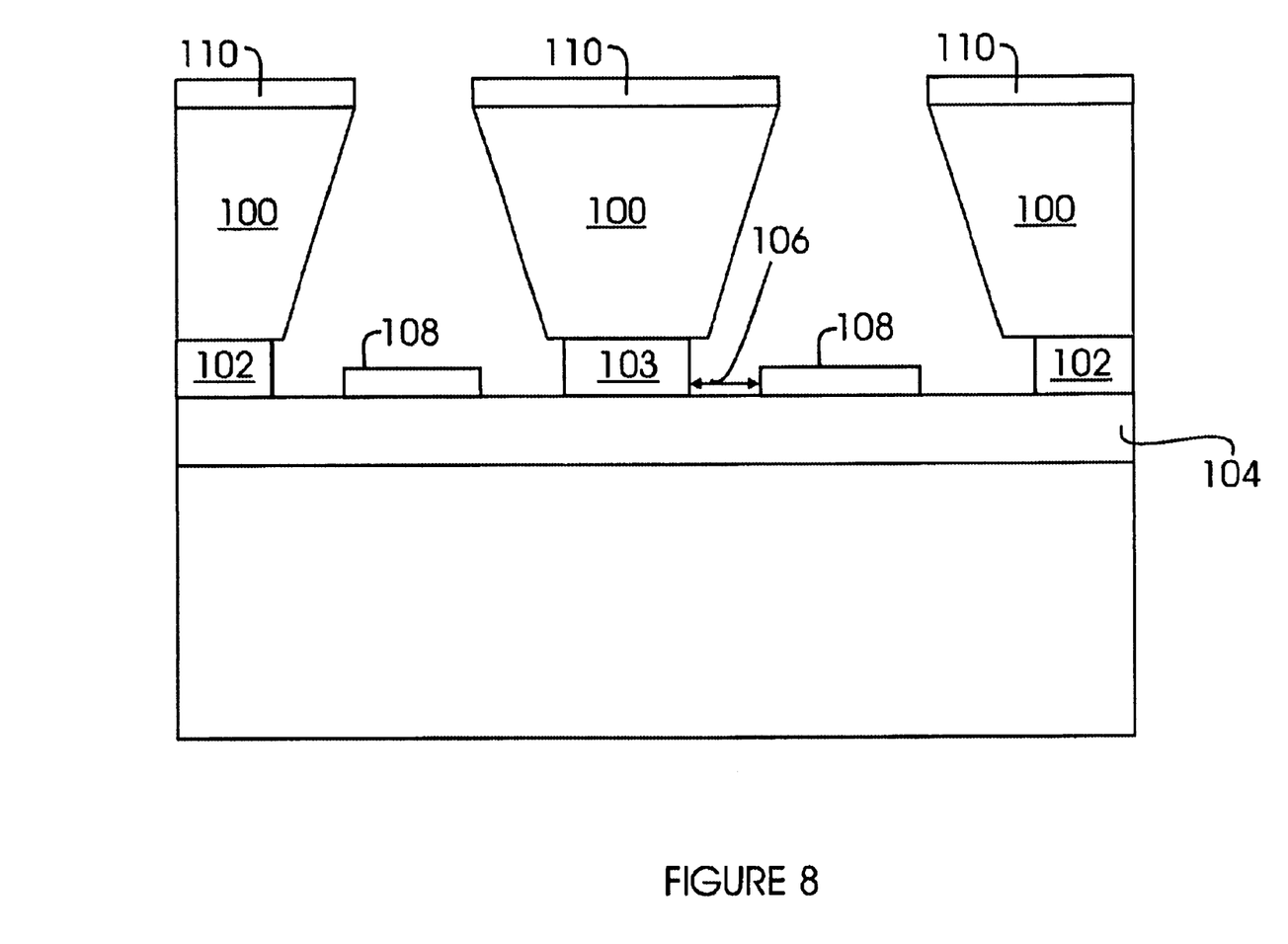
FIG. 8 is a cross-section view of a transistor fabricated by a self-aligned fabrication process in an embodiment of the present invention.

FIG. 8 illustrates the results of the next step in the HBT self-aligned fabrication process. Here, a base contact 108 is evaporated onto the base semiconductor layer 104. In addition, during this evaporation process, an excess contact layer 110 is deposited on top of the photo-resist layer 100. Typically, the base contact 108 and the excess contact layer 110 are metals and may comprise a combination of layers of metals including platinum, gold and either palladium or titanium. In an embodiment, the base contact 108 and the excess contact layer 110 may comprise a layer of either titanium or palladium that is approximately 100–200 A deep, a layer of platinum over the layer of titanium that is approximately 300–400 deep and a layer of gold over the layer of platinum that is approximately 1000 A–1.2 microns deep. Further, the base contact 108 may be approximately one micron in width. In addition, the base-emitter separation between the emitter semiconductor mesa 103 and the base contact 108 may be 0.3 microns in width.

Figure 9:
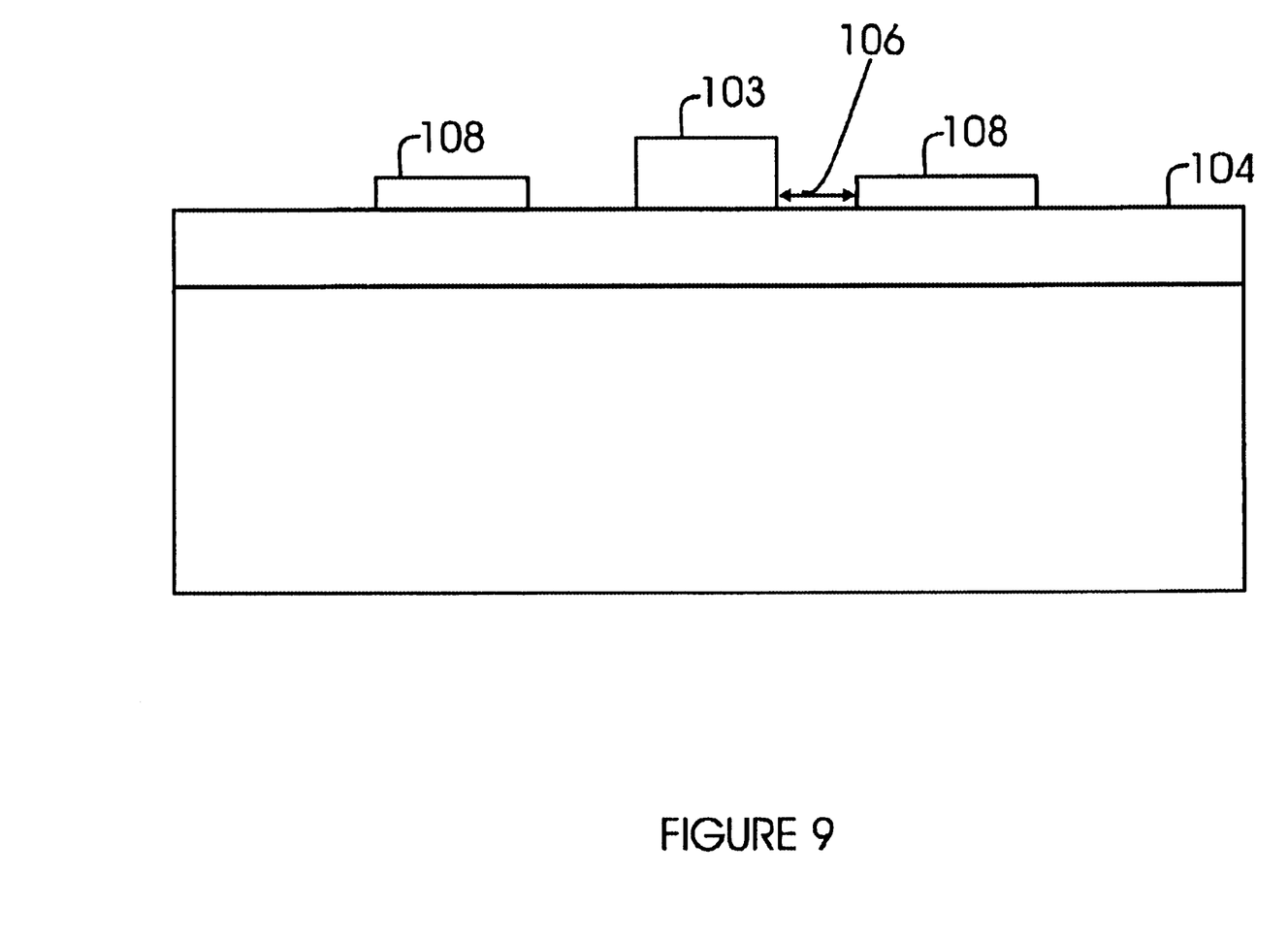
FIG. 9 is a cross-section view of a transistor fabricated by a self-aligned fabrication process in an embodiment of the present invention.

Next, the photo-resist layer 100 and the excess contact metal layer 110 are removed from the transistor. This may be accomplished by either a wet or a dry etching process. The results of this step are illustrated in FIG. 9. After the etching process, the remaining elements in the transistor are the base contact metal 8 and the emitter semiconductor mesa 103, both of which are attached to the base semiconductor layer 104.

Figure 10:
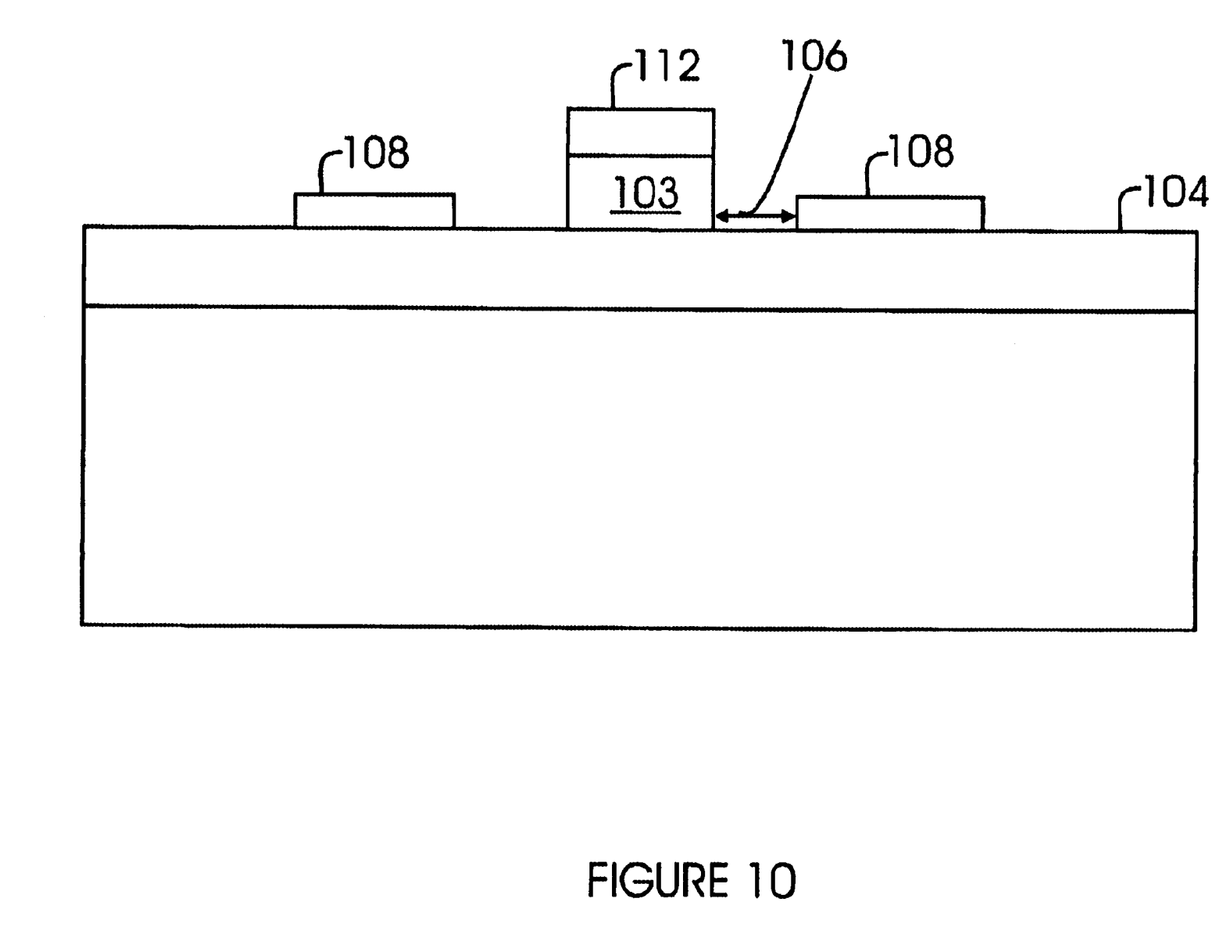
FIG. 10 is a cross-section view of a transistor fabricated by a self-aligned fabrication process in an embodiment of the present invention.

Finally, as shown in FIG. 10 an emitter contact 112 is evaporated onto the emitter semiconductor mesa 103 to provide the final HBT transistor. Typically, the emitter contact 112 is made of metal and may comprise one or more metals from the group including titanium, platinum and gold. In an embodiment, the emitter contact 112 may comprise a layer of titanium that is approximately 100–200 Å deep, a layer of platinum over the layer of titanium that is approximately 300–400 deep and a layer of gold over the layer of platinum that is approximately 1000 Å–1.2 microns deep. In addition, the emitter contact 108 will typically be the same width as the emitter semiconductor mesa and may be approximately one micron in width. At this point, further processing can be done to the transistor depending upon performance needs of the specific IC.

The HBT self-aligned fabrication process of the present invention offers several advantages over the conventional self-aligned fabrication process. For example, it is much easier to passivate the space between the emitter semiconductor mesa 103 and the base contact 108 as compared to passivating the gap 14 using the conventional HBT fabrication process. This is because there is not any opening between the base contact 108 and the emitter contact 112 and subsequent gap because the emitter contact 112 is not applied in the HBT fabrication process of the present invention until the final step. Accordingly, the number of voids can be reduced, which increases the yield during the manufacturing process and the long term reliability.

In addition, the separation distance between the emitter contact 112 and the base contact 108 is greater in transistors manufactured by the self-aligned fabrication process of the present invention than the conventional process. Importantly, this applies even when the base-emitter separation distance 106 is identical to that found in the conventional HBT fabrication process. Therefore, there is less likelihood of a short circuit in the transistor, and which produces a higher yield.

Further, a thinner emitter semiconductor layer 102 may be used in the self-aligned fabrication process of the present invention. This results from the fact that the overhang of the emitter contact 112 over the emitter semiconductor mesa 103 (which is determined by the height of the emitter semiconductor mesa 103) is not required to separate the emitter contact 112 and the base contact 108.

Moreover, as discussed above, the wet etching process is better controlled in the self-aligned fabrication of the present invention because there is not any metal in the vicinity of the emitter semiconductor mesa 103. In addition, the under-cut is controlled by the resist profile. If required, other photo-resist processing techniques, such as an image reversal photo-resist process or a bi-layer photo-resist process, may be used to provide a larger base emitter gap. Finally, passivating the base-emitter interface is easier as the base emitter interface is more open compared to the conventional process because it is not surrounded by any metal.

While this application of a HBT self-aligned fabrication method is one embodiment of the present invention, other embodiments are possible. For example, an embodiment can relate to manufacturing of other semiconductor devices such as any other devices that require a self-aligned manufacturing process including photo-diodes, high quality varactors, etc.

The present invention has been described with respect to particular embodiments thereof, and numerous modifications can be made which are within the scope of the invention as set forth in the claims.

What is claimed is:

1. A method of fabricating a semiconductor device comprising the steps of:
    forming a first semiconductor layer;
    forming a second semiconductor layer over the first semiconductor layer;
    forming a mask over a first portion of the second semiconductor layer;
    removing a second portion of the second semiconductor layer not covered by the mask to form a semiconductor mesa;
    forming a first electrical connector on the first semiconductor layer self-aligned with respect to the semiconductor mesa; and forming a second electrical connector on the first portion of the second semiconductor layer, wherein the second electrical connector is aligned with respect to the semiconductor mesa after the first connector is self-aligned with respect to the semiconductor mesa.

2. The method of claim 1, wherein the first semiconductor layer comprises one or more substances from a group consisting of gallium arsenide and indium phosphide.

3. The method of claim 1, wherein the first semiconductor layer is approximately 300–1000 Å deep.

4. The method of claim 3, wherein the first semiconductor layer is approximately 500 Å deep.

5. The method of claim 1, wherein the second semiconductor layer comprises one or more substances from a group consisting of gallium arsenide and indium phosphide.

6. The method of claim 1, wherein the second semiconductor layer is approximately 1000–3000 Å deep.

7. The method of claim 6, wherein the second semiconductor layer is approximately 1250 Å deep.

8. The method of claim 6, where the second semiconductor layer is approximately 2250 Å deep.

9. The method of claim 1, wherein the mask comprises a photo-resist layer.

10. The method of claim 9, wherein the photo-resist layer comprises an organic polymer material.

11. The method of claim 1, wherein the mask is approximately 1–3 microns deep.

12. The method of claim 1, wherein the step of forming a mask over a first portion of the second semiconductor layer further comprises the step of creating one or more openings in the mask.

13. The method of claim 12, wherein the mask having one or more openings further comprises a top surface and a bottom surface next to the second semiconductor layer, and
    wherein the mask having one or more openings is wider at the top surface of the mask and narrower at the bottom surface of the mask next to the second semiconductor layer and comprises a substantially overhanging shape.

14. The method of claim 1, wherein the step of removing a second portion of the second semiconductor layer is performed by wet etching.

15. The method of claim 1, wherein the step of removing a second portion of the second semiconductor layer is performed by dry etching.

16. The method of claim 1, wherein the first electrical connector comprises one or more substances from a group consisting of titanium, platinum and gold.

17. The method of claim 16, wherein the first electrical connector comprises a layer of titanium that is approximately 100–200 A deep, a layer of platinum over the layer of titanium that is approximately 300–400 A deep and a layer of gold over the layer of platinum that is approximately 1000 A–1.2 microns deep.

18. The method of claim 1, wherein the first electrical connector comprises one or more substances from a group consisting of palladium, platinum and gold.

19. The method of claim 18, wherein the first electrical connector comprises a layer of palladium that is approximately 100–200 A deep, a layer of platinum over the layer of titanium that is approximately 300–400 A deep and a layer of gold over the layer of platinum that is approximately 1000 A–1.2 microns deep.

20. The method of claim 1, wherein the first electrical connector is approximately one micron in width.

21. The method of claim 1, wherein the second electrical connector comprises one or more substances from a group consisting of titanium, platinum and gold.

22. The method of claim 21, wherein the second electrical connector comprises a layer of titanium that is approximately 100–200 A deep, a layer of platinum over the layer of titanium that is approximately 300–400 A deep and a layer of gold over the layer of platinum that is approximately 1000 A–1.2 microns deep.

23. The method of claim 1, wherein the second electrical connector is approximately one micron in width.

24. The method of claim 1, wherein the step of forming a first electrical connector is performed by evaporation.

25. The method of claim 1, wherein the step of forming a second electrical connector is performed by evaporation.

26. The method of claim 1, wherein the semiconductor device is a transistor.

27. The method of claim 26, wherein the transistor is a bipolar transistor.

28. The method of claim 27, wherein the bipolar transistor is a heterojunction bipolar transistor.

29. The method of claim 1, wherein the first electrical connector is approximately 0.3 microns from the first portion of the second semiconductor layer.

30. A method of manufacturing a semiconductor device comprising the steps of:
    forming a first semiconductor layer;
    forming a second semiconductor layer over the first semiconductor layer;
    covering a first portion of the second semiconductor layer;
    removing a second portion of the second semiconductor layer not covered in the covering step to form a semiconductor mesa;
    attaching a first electrical contact to the first semiconductor layer, wherein the first electrical contact is self-aligned with respect to the semiconductor mesa; and
    attaching a second electrical contact to the first portion of the second semiconductor layer, wherein the second electrical contact is aligned with respect to the semiconductor mesa after the first electrical contact is aligned.

31. The method of claim 30, wherein the first semiconductor layer comprises one or more substances from a group consisting of gallium arsenide and indium phosphide.

32. The method of claim 30, wherein the first semiconductor layer is approximately 300–1000 A deep.

33. The method of claim 32, wherein the first semiconductor layer is approximately 500 A deep.

34. The method of claim 30, wherein the second semiconductor layer comprises one or more substances from a group consisting of gallium arsenide and indium phosphide.

35. The method of claim 30, wherein the second semiconductor layer is approximately 1000–3000 A deep.

36. The method of claim 35, wherein the second semiconductor layer is approximately 1250 A deep.

37. The method of claim 35, wherein the second semiconductor layer is approximately 2250 A deep.

38. The method of claim 30, wherein the step of covering a first portion of the second semiconductor layer further comprises covering the first portion of the second semiconductor layer with a mask.

39. The method of claim 38, wherein the mask comprises a photo-resist layer.

40. The method of claim 39, wherein the photo-resist layer comprises an organic polymer material.

41. The method of claim 30, wherein the mask is approximately 1–3 microns deep.

42. The method of claim 38, wherein the step of covering a first portion of the second semiconductor layer with a mask further comprises the step of creating one or more openings in the mask.

43. The method of claim 42, wherein the mask having one or more openings further comprises a top surface and a bottom surface next to the second semiconductor layer, and
    wherein the mask having one or more openings is wider at the top surface of the mask and narrower at the bottom surface of the mask next to the second semiconductor layer such that the top surface overhangs the bottom surface.

44. The method of claim 30, wherein the step of removing a second portion of the second semiconductor layer is performed by wet etching.

45. The method of claim 30, wherein the step of removing a second portion of the second semiconductor layer is performed by dry etching.

46. The method of claim 30, wherein the first electrical connector comprises one or more substances from a group consisting of titanium, platinum and gold.

47. The method of claim 46, wherein the first electrical connector comprises a layer of titanium that is approximately 100–200 A deep, a layer of platinum over the layer of titanium that is approximately 300–400 A deep and a layer of gold over the layer of platinum that is approximately 1000 A–1.2 microns deep.

48. The method of claim 30, wherein the first electrical connector comprises one or more substances from a group consisting of palladium, platinum and gold.

49. The method of claim 48, wherein the first electrical connector comprises a layer of palladium that is approximately 100–200 A deep, a layer of platinum over the layer of titanium that is approximately 300–400 A deep and a layer of gold over the layer of platinum that is approximately 1000 A–1.2 microns deep.

50. The method of claim 30, wherein the first electrical connector is approximately one micron in width.

51. The method of claim 30, wherein the second electrical connector comprises one or more substances from a group consisting of titanium, platinum and gold.

52. The method of claim 51, wherein the second electrical connector comprises a layer of titanium that is approximately 100–200 A deep, a layer of platinum over the layer of titanium that is approximately 300–400 A deep and a layer of gold over the layer of platinum that is approximately 1000 A–1.2 microns deep.

53. The method of claim 30, wherein the second electrical connector is approximately one micron in width.

54. The method of claim 30, wherein the step of attaching a first electrical connector is performed by evaporation.

55. The method of claim 30, wherein the step of attaching a second electrical connector is performed by evaporation.

56. The method of claim 30, wherein the semiconductor device is a transistor.

57. The method of claim 56, wherein the transistor is a bipolar transistor.

58. The method of claim 57, wherein the bipolar transistor is a heterojunction bipolar transistor.

59. The method of claim 30, wherein the first electrical connector is approximately 0.3 microns from the first portion of the second semiconductor layer.

60. A method of fabricating a semiconductor device comprising the steps of:

forming a first semiconductor layer;

forming a second semiconductor layer over the first semiconductor layer;

selectively removing a portion of the second semiconductor layer to form a semiconductor mesa;

forming a first electrical connector on the first semiconductor layer that is self-aligned with respect to the semiconductor mesa; and forming a second electrical connector to the semiconductor mesa, wherein the second electrical connector is aligned after the first electrical connector is aligned with respect to the semiconductor mesa and is the same size or smaller than the semiconductor mesa.

61. The method of claim 60, wherein the first semiconductor layer comprises one or more substances from a group consisting of gallium arsenide and indium phosphide.

62. The method of claim 60, wherein the first semiconductor layer is approximately 300–1000 A deep.

63. The method of claim 62, wherein the first semiconductor layer is approximately 500 A deep.

64. The method of claim 60, wherein the second semiconductor layer comprises one or more substances from a group consisting of gallium arsenide and indium phosphide.

65. The method of claim 60, wherein the second semiconductor layer is approximately 1000–3000 A deep.

66. The method of claim 35, wherein the first semiconductor layer is approximately 1250A deep.

67. The method of claim 65, wherein the first semiconductor layer is approximately 2250A deep.

68. The method of claim 60, wherein the step of selectively removing a portion of the second semiconductor layer to form a semiconductor mesa further comprises the steps of:

covering the second semiconductor layer with a mask, and removing the portion of the second semiconductor layer not covered with the mask to form the semiconductor mesa.

69. The method of claim 68, wherein the mask comprises a photo-resist layer.

70. The method of claim 69, wherein the photo-resist layer comprises an organic polymer material.

71. The method of claim 60, wherein the mask is approximately 1–3 microns deep.

72. The method of claim 68, wherein the step of covering the second semiconductor layer with a mask further comprises the step of creating one or more openings in the mask.

73. The method of claim 72, wherein the mask having one or more openings further comprises a top surface and a bottom surface next to the second semiconductor layer, and wherein the mask having one or more openings is wider at the top surface of the mask and narrower at the bottom surface of the mask next to the second semiconductor layer and the top surface overhangs the bottom surface.

74. The method of claim 60, wherein the step of selectively removing a portion of the second semiconductor layer is performed by wet etching.

75. The method of claim 60, wherein the step of selectively removing a portion of the second semiconductor layer is performed by dry etching.

76. The method of claim 60, wherein the first electrical connector comprises one or more substances from a group consisting of titanium, platinum and gold.

77. The method of claim 76, wherein the first electrical connector comprises a layer of titanium that is approximately 100–200 A deep, a layer of platinum over the layer of titanium that is approximately 300–400 A deep and a layer of gold over the layer of platinum that is approximately 1000 A–1.2 microns deep.

78. The method of claim 60, wherein the first electrical connector comprises one or more substances from a group consisting of palladium, platinum and gold.

79. The method of claim 78, wherein the first electrical connector comprises a layer of palladium that is approximately 100–200 A deep, a layer of platinum over the layer of titanium that is approximately 300–400 A deep and a layer of gold over the layer of platinum that is approximately 1000 A–1.2 microns deep.

80. The method of claim 60, wherein the first electrical connector is approximately one micron in width.

81. The method of claim 60, wherein the second electrical connector comprises one or more substances from a group consisting of titanium, platinum and gold.

82. The method of claim 81, wherein the second electrical connector comprises a layer of titanium that is approximately 100–200 A deep, a layer of platinum over the layer of titanium that is approximately 300–400 A deep and a layer of gold over the layer of platinum that is approximately 1000 A–1.2 microns deep.

83. The method of claim 60, wherein the second electrical connector is approximately one micron in width or smaller.

84. The method of claim 60, wherein the step of forming a first electrical connector is performed by evaporation.

85. The method of claim 60, wherein the step of forming a second electrical connector is performed by evaporation.

86. The method of claim 60, wherein the semiconductor device is a transistor.

87. The method of claim 86, wherein the transistor is a bipolar transistor.

88. The method of claim 87, wherein the bipolar transistor is a heterojunction bipolar transistor.

89. The method of claim 60, wherein the first electrical connector is approximately 0.3 microns from the first portion of the second semiconductor layer.

* * * * *